(12) United States Patent
Morton

(10) Patent No.: US 8,339,873 B1
(45) Date of Patent: Dec. 25, 2012

(54) MEMORY DEVICE AND METHOD THEREOF

(76) Inventor: Bruce Lee Morton, Lakeway, TX (US)

( * ) Notice: Subject to any disclaimer, the term of this patent is extended or adjusted under 35 U.S.C. 154(b) by 241 days.

(21) Appl. No.: 12/768,282

(22) Filed: Apr. 27, 2010

(51) Int. Cl.
  *G11C 7/08* (2006.01)
(52) U.S. Cl. .................................. 365/189.15; 365/205
(58) Field of Classification Search ............. 365/189.15, 365/205
  See application file for complete search history.

(56) References Cited

U.S. PATENT DOCUMENTS

| | | |
|---|---|---|
| 3,983,410 A | 9/1976 | Stalley |
| 5,010,524 A | 4/1991 | Fifield et al. |
| 5,014,235 A | 5/1991 | Morton |
| 5,140,556 A | 8/1992 | Cho et al. |
| 5,475,643 A | 12/1995 | Ohta |
| 6,646,312 B1 | 11/2003 | Kikuchi |
| 6,678,194 B2 | 1/2004 | Ishikawa |
| 7,045,849 B2 | 5/2006 | Chen et al. |
| 7,099,218 B2 | 8/2006 | Wicht et al. |
| 7,236,389 B2 | 6/2007 | Hsu |
| 7,372,730 B2 | 5/2008 | Chen |
| 7,443,757 B2 | 10/2008 | Cernea et al. |
| 7,466,575 B2 | 12/2008 | Shalvi et al. |
| 7,509,607 B2 | 3/2009 | Ikeda |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,751,240 B2 | 7/2010 | Shalvi |
| 7,773,413 B2 | 8/2010 | Shalvi |
| 7,821,826 B2 | 10/2010 | Shalvi et al. |
| 7,864,573 B2 | 1/2011 | Perlmutter et al. |
| 7,881,107 B2 | 2/2011 | Shalvi |
| 7,900,102 B2 | 3/2011 | Sokolov et al. |
| 7,924,587 B2 | 4/2011 | Perlmutter et al. |
| 7,924,613 B1 | 4/2011 | Sommer et al. |
| 7,924,648 B2 | 4/2011 | Sokolov et al. |
| 7,925,936 B1 | 4/2011 | Sommer |
| 7,975,192 B2 | 7/2011 | Sommer et al. |
| 7,995,388 B1 | 8/2011 | Winter et al. |
| 8,000,135 B1 | 8/2011 | Perlmutter et al. |
| 8,000,141 B1 | 8/2011 | Shalvi et al. |
| 8,001,320 B2 | 8/2011 | Sokolov et al. |
| 8,050,086 B2 | 11/2011 | Shalvi et al. |
| 8,059,457 B2 | 11/2011 | Perlmutter et al. |
| 8,060,806 B2 | 11/2011 | Shalvi et al. |
| 8,068,360 B2 | 11/2011 | Anholt |

(Continued)

FOREIGN PATENT DOCUMENTS

WO 2007113731 A1 10/2007

(Continued)

OTHER PUBLICATIONS

Smith, Julius O., "Mathematics of the Discrete Fourier Transform (DFT) with Audio Applications," Second Edition, May 2008, ISBN 978-0-9745607-4-8, Chapters 7 and 8, 43 pages.

(Continued)

*Primary Examiner* — Michael Tran

(57) ABSTRACT

A first input of a sense amplifier is connected to a first bitline, a second input of the sense amplifier is connected to a second bitline, a third input of the sense amplifier is coupled to a third bitline. The sense amplifier provides at an output an indicator of a storage state of a memory cell connected to the first bitline based upon information provided to the sense amplifier via the first, second, and third bitlines.

20 Claims, 10 Drawing Sheets

U.S. PATENT DOCUMENTS

| | | |
|---|---|---|
| 8,085,586 B2 | 12/2011 | Golov et al. |
| 8,145,984 B2 | 3/2012 | Sommer et al. |
| 8,151,163 B2 | 4/2012 | Shalvi et al. |
| 8,151,166 B2 | 4/2012 | Shalvi et al. |
| 8,156,398 B2 | 4/2012 | Sommer |
| 8,156,403 B2 | 4/2012 | Shalvi et al. |
| 8,169,825 B1 | 5/2012 | Shalvi et al. |
| 8,174,857 B1 | 5/2012 | Sommer et al. |
| 8,174,905 B2 | 5/2012 | Shalvi et al. |
| 8,208,304 B2 | 6/2012 | Shalvi et al. |
| 8,209,588 B2 | 6/2012 | Perlmutter et al. |
| 2007/0097753 A1* | 5/2007 | Choi ................. 365/189.05 |
| 2009/0189708 A1 | 7/2009 | Merritt |

FOREIGN PATENT DOCUMENTS

| | | |
|---|---|---|
| WO | 2009003063 A1 | 3/2009 |

OTHER PUBLICATIONS

Notice of Allowance mailed Feb. 2, 2012 for U.S. Appl. No. 12/768,299, 15 pages.

Fisch, David et al., " Z-RAM Ultra-Dense Memory for 90nm and Below," Presentation, Hot Chips 2006, Aug. 21, 2006, downloaded from <<http://www.hotchips.org/archives/hc18/>>, 35 pages.

Hidaka, Hideto et al., "Twisted Bit-Line Architectures for Multi-Megabit DRAM's," IEEE Journal of Solid-State Circuits, vol. 24, No. 1, Feb. 1989, pp. 21-27.

Min, Dong-Sun et al., "Multiple Twisted Dataline Techniques for Multigigabit Dram's," IEEE Journal of Solid-State Circuits, vol. 34, No. 6, Jun. 1999, pp. 856-865.

Byeon, Dae-Seok et al., "An 8Gb Multi-Level NAND Flash Memory with 63nm STI CMOS Process Technology," 2005 IEEE International Solid-State Circuits Conference, Digest of Technical Papers, pp. 46-47.

Nobunaga, Dean et al., "A 50nm Gb NAND Flash Memory with 100MB/s Program Throughput and 200MB/s DDR Interface," 2008 IEEE International Solid-State Circuits Conference, Digest of Technical Papers, pp. 426-427.

Imamiya, Kenichi et al., "A 125-mm2 1-Gb NAND Flash Memory with 10-MByte/s Program Speed," IEEE Journal of Solid-State Circuits, vol. 37, No. 11, Nov. 2002, pp. 1493-1501.

Blagojevic, M. et al., "501 Capacitor-Less 1-Transistor DRAAM Sensing Scheme with Automatic Reference Generation", Lausanne, Switzerland, 2004 Symposium on VLS1 Circuits Digest of Technical Papers, pp. 182-183.

Jeong, Hoon et al., "Capacitorless DRZM Cell with Highly Scalable Surrounding Gate Structure", Extended Abstracts of the 2006 International Conference on Solid State Devices and Materials, Yokohama, pp. 574-575.

Suzuki, Toshikazu et al., "A Stable 2-Port SRAM Cell Design Against Simultaneously Read/Write-Disturbed Accesses", IEEE Journal of Solid-State Circuits, vol. 34, No. 9, Sep. 2008, pp. 2109-2119.

Chang, Leland et al., "An 8T-SRAM for Variability Tolerance and Low-Voltage Operation in High-Performance Caches", IEEE Journal of Solid-State Circuits, vol. 43, No. 4, Apr. 2008, pp. 956-963.

Singh, Anant et al., "A 2ns-Read-Latency 4Mb Embedded Floating-Body Memory Macro in 45nm SOI Technology", 2009 IEEE International Solid State Circuits Conference, Digest of Technical Papers, pp. 460-461.

Smith, III, Julious O., "Spectral Audio Signal Processing", Center for Computer Research in Music and Acoustics, Stanford University, Copyright Sep. 16, 2009, printed from <<https://ccrma.stanford.edu/~jos/sasp/ Cylic_FFT_Convolution.html>> and <<https://ccrma.stanford.edu/~jos/sasp/Convolution_Short_Signals.html>>, 3 pages.

Kankelborg, C., "DFF and FFT", Rev. Jan. 28, 2009, printed from << http://solar.physics.montana.edu/kankel/ph567/examples/Octave/dft/dft.pdf>> on Apr. 26, 2010, 17 pages.

Johns, David et al., "Analog Integrated Circuit Design", Copyright 1997 by John Wiley and Sons, ISBN 0-471-14448-7, pp. 137-142.

Baker, R. Jacob et al., "CMOS: Circuit Design, Layout and Simulation", Copyright 1998 by IEEE, Inc., ISBN 0-7803-3416-7, pp. 731-738.

U.S. Appl. No. 12/768,299, filed Apr. 27, 2010 entitled "Memory Device and Method Thereof".

U.S. Appl. No. 13/481,924, filed May 28, 2012, entitled "Memory Device and Method Thereof".

* cited by examiner

MEMORY DEVICE AND METHOD THEREOF

FIELD OF THE DISCLOSURE

Generally, the present invention relates to electronic devices, and more specifically to electronic devices including memory.

BACKGROUND OF THE DISCLOSURE

Memory arrays formed at semiconductor substrates are used to store information for later retrieval. Individual memory devices in such arrays, also referred to as memory cells, typically communicate with sense amplifiers that determine a state of the memory cells through interconnects that are substantially parallel conductors to provide signal paths between the memory cells and the sense amplifiers. A problem that often arises in memory design is undesired communication between signal paths due to close proximity of memory array conductors and supporting modules.

DETAILED DESCRIPTION OF THE DRAWINGS

The present disclosure relates to memory devices and devices including memory devices. In particularly, the memory devices have sense amplifiers that receive and convert information signals from a memory array via bitlines to signals, such as logic state signals, that are useful elsewhere. In accordance with a specific embodiment of the present disclosure, the memory device mitigates the effect of crosstalk that can affect the information signals communicated to the sense amplifiers via the bitlines. For example, the cross-talk effect between conductive elements of the memory device can be mitigated by application of a spatial filter that compensates for cross-talk information intermingled at one conductive element, such as a bitline, that is introduced from spatially separate conductive elements.

Figure 1:
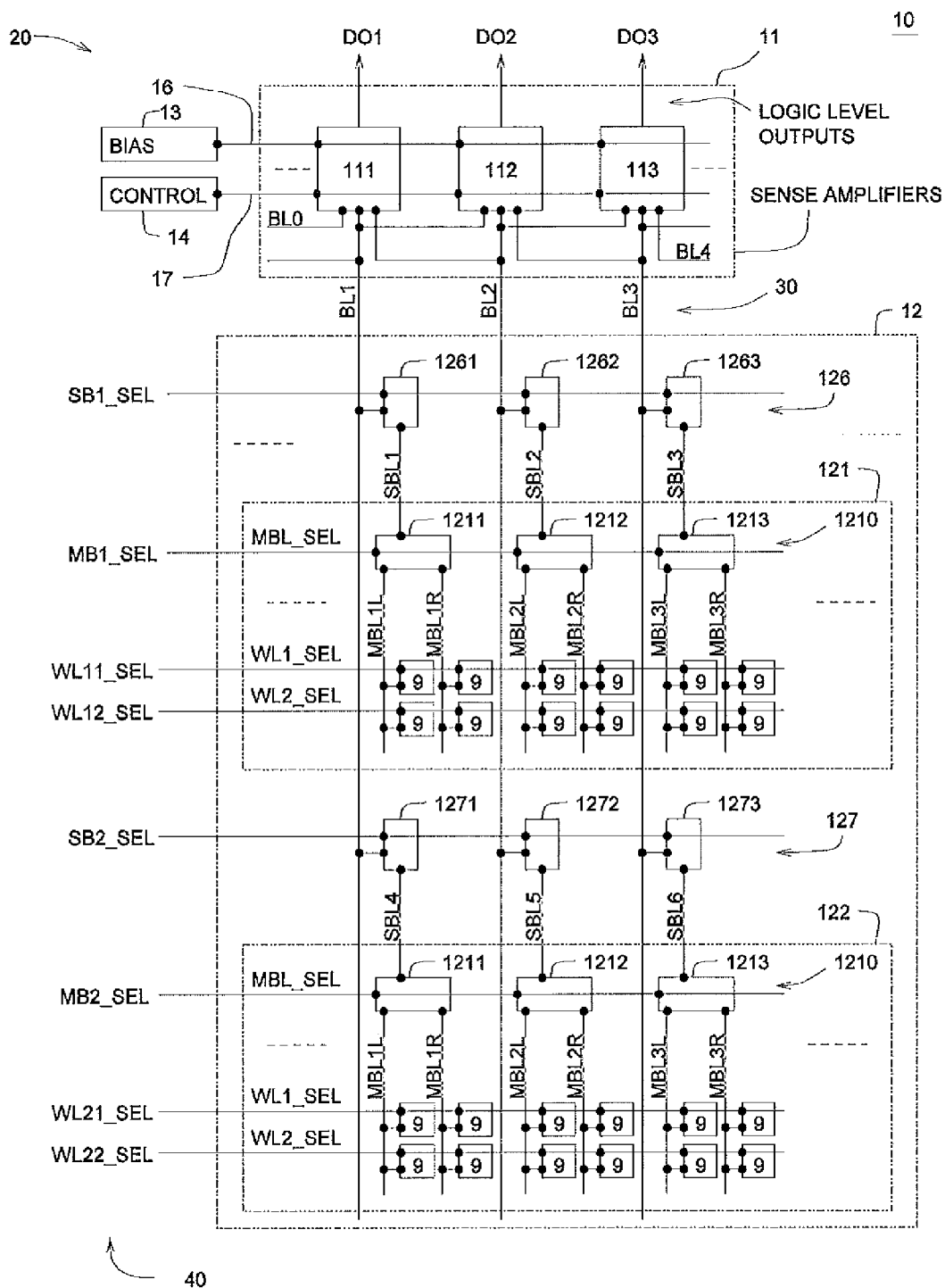
FIG. 1 illustrates in block diagram form a memory array that includes sense amplifiers in accordance with the present disclosure.

FIG. 1 illustrates a portion of a device that includes a memory 20 in accordance with one embodiment of the present disclosure. The device of FIG. 1 can be a dedicated memory device, a general purpose data processor, an application specific data processor, a computing device, such as a portable or non-portable computer device, and the like. Memory 20 includes a plurality of sense amplifiers 11, a bias module 13, a control module 14, and an array 12.

Bias module 13 is connected to the plurality of sense amplifiers 11 by an interconnect 16. Control module 14 is connected to the plurality of sense amplifiers 11 by interconnect 17. Array 12 is connected to an array control module (not illustrated) by interconnect 40, and to the plurality of sense amplifiers 11 by interconnect 30. Interconnect 40 includes a plurality of interconnects including interconnects labeled: SB1_SEL, MB1_SEL, WL11_SEL, WL12_SEL, SB2_SEL, MB2_SEL, WL21_SEL, and WL2_SEL. Interconnect 30 includes a plurality of interconnects labeled BL1-BL3 that are connected to multiple sub-arrays as described below.

The plurality of sense amplifiers 11 specifically illustrates sense amplifiers 111-113. Not specifically illustrated at FIG. 1 are additional sense amplifiers and other related memory elements to the left and right of the illustrated sense amplifiers 111 and 113. Inputs of sense amplifier 111 are connected to interconnect BL1 to interconnect BL2, and to interconnect BL0, which is also connected another sense amplifier, not illustrated, to the left of sense amplifier 111. Inputs of sense amplifier 112 are connected to interconnects BL1-BL3, respectively. Inputs of sense amplifier 113 are connected to interconnects BL2-BL3, respectively, where bitline BL4 is also connected to another sense amplifier, not illustrated, to the right of sense amplifier 113. Each of the interconnects BL0-BL4 is connected to a corresponding sense amplifier of the plurality of sense amplifiers 11, and is, therefore, considered an upper-most level bitline interconnect, and, therefore, can also be referred to as a sense-amp bitline. Outputs of sense amplifiers 111-113 are connected to interconnects DO1-DO3, respectively, to provide a signal indicator indicating the storage state of corresponding memory cells during a read operation.

Unless specifically indicated otherwise, the various interconnects disclosed herein are used to communicate information between various portions of memory 20 either directly or indirectly. For example, an interconnect can be implemented as a passive device, such as one or more conductors that include metal, that transmit information between various modules. An interconnect can also refer to a combination of passive and active devices, for example, an active device can include a device that buffers, e.g., stores and provides, information being communicated between a source device and a destination device.

The term "memory bitline" as used herein is intended to refer to a specific set of bitline interconnects and bitline select modules that connect a specific memory cell of a memory array to a specific sense amplifier, thereby allowing a signal from the memory cell to be communicated to the sense amplifier. The term "bitline interconnect" as used herein is intended to refer to an interconnect of a memory bitline. The term "bitline select module" as used herein is intended to refer to a module of a memory bitline through which one or more lower level bitline interconnects is connected to a higher-level bitline interconnect. The term "bitline" when not specifically qualified as indicated in this paragraph is used generically herein to refer to one or more of a bitline interconnect or a bitline select module.

For ease of reference, a label associated with an interconnect can also be used herein to refer to a signal or information communicated via that interconnect, and to refer to additional features of the device. For example, the label BL1 can be used to refer to the following: the interconnect BL1 or bitline interconnect BL1 as described above; and to a signal BL1, which is a signal communicated over interconnect BL1. An interconnect as it relates to a specific feature can also be referred to herein as an input or an output of a feature. Therefore, the relationship between the plurality of sense amplifiers 11 and interconnect BL1 can be described by stating that a terminal BL1 of the plurality of sense amplifiers 11 is connected to interconnect BL1. In addition, the relationship between the sense amplifier 111 and interconnect BL1 can be described by stating that a terminal of sense amplifier 111 is connected to interconnect BL1, or that a terminal of sense amplifier 111 is connected to the terminal BL1 of plurality of sense amplifiers 11.

Array 12 includes a sub-array 121, a sub-array 122, a plurality of bitline select modules 126, and a plurality of bitline select modules 127. The plurality of bitline select modules 126 includes bitline select modules 1261-1263, where each bitline select module of the plurality of bitline select modules 126 includes an enable input connected to interconnect SB1_SEL, a first data terminal connected to a corresponding next higher-level bitline interconnect, and a second data terminal connected to a corresponding next lower-level bitline interconnect that is also connected to sub-array 121. The plurality of bitline select modules 127 includes bitline select modules 1271-1273, where each bitline select module of the plurality of bitline select modules 127 includes an enable input connected to interconnect SB2_SEL, a first data terminal connected to a corresponding next higher-level bitline interconnect, and a second data terminal connected to a corresponding next lower-level bitline interconnect that is also connected to sub-array 122.

Sub-array 121 and sub-array 122 are instances of the same sub-array design, therefore, their respective elements are numbered identically. Sub-array 121 includes a plurality of bitline select modules 1210, including bitline select module 1211-1213, and a plurality of individual memory cells 9.

Bitline select module 1211 has a select input connected to an interconnect labeled MBL_SEL that is connected to interconnect MB1_SEL, a first data terminal connected to a next higher-level interconnect, interconnect SBL1, that is a bitline interconnect that can also be referred to as sub-array bitline or a bitline segment of sub-array 121. Bitline select module 1211 further includes a second data terminal connected to a next lower-level interconnect, interconnect MBL1L, that is selectable, and a third data terminal connected to another next lower-level interconnect MBL1R, that is selectable. Interconnects MBL1L and MBL1R are lowest-level bitline interconnects of a memory bitline. Bitline select module 1212 has a select input connected to an interconnect labeled MBL_SEL that is connected to interconnect MB1_SEL, a first data terminal connected to a next higher-level interconnect, interconnect SBL2, a second data terminal connected to a next lower-level interconnect, interconnect MBL2L, that is selectable, and a third data terminal connected to another next lower-level interconnect MBL2R, that is selectable. Bitline select module 1213 has a select input connected to an interconnect labeled MBL_SEL that is connected to interconnect MB1_SEL, a first data terminal connected to a next higher-level interconnect, interconnect SBL3, a second data terminal connected to a next lower-level interconnect, interconnect MBL3L, that is selectable, and a third data terminal connected to another next lower-level interconnect MBL3R, that is selectable.

Each memory cell 9 of the plurality of memory cells is connected to one of the plurality of interconnects (MBL1L, MBL1R, MBL2L, MBL2R, MBL3L and MBL3R), and to one of the plurality of word lines (WL1_SEL, and WL2_SEL). Each memory cell 9 at a top row of sub-array 121 has a select input that is connected to interconnect WL1_SEL, which is a word line that is connected to interconnect WL11_SEL. Each of the memory cells at the second row of sub-array 121 has a select input that is connected to interconnect WL2_SEL that is connected to memory level interconnect WL12_SEL. Each memory cell 9 at a left-most column of sub-array 121 has a data terminal connected to interconnect MBL1L. Each memory cell 9 at a second column of sub-array 121 has a data terminal connected to interconnect MBL1R. Each memory cell 9 at a third column of sub-array 121 has a data terminal connected to interconnect MBL2L. Each memory cell 9 at a fourth column of sub-array 121 has a data terminal connected to interconnect MBL2R. Each memory cell 9 at a fifth column of sub-array 121 has a data terminal connected to interconnect MBL3L. Each memory cell 9 at a sixth of sub-array 121 has a data terminal connected to interconnect MBL3R.

Because sub-array 121 and sub-array 122 are instances of the same sub-array design, the labels and reference numbers of sub-array 121 are repeated for sub-array 122. However, the first data terminals of selection modules 1211-1213 of sub-array 122 are connected to interconnects SBL4-SBL6, the interconnect MBL_SEL at sub-array 122 is connected to interconnect MB2_SEL, word line WL1_SEL at sub-array 122 is connected to interconnect WL21_SEL, and word line WL2_SEL of sub-array 122 is connected to interconnect WL22_SEL.

During a read operation, two rows of memory cells can be contemporaneously selected, one at sub array 121 by assertion of one of the word lines and one at sub array 122, by assertion of a corresponding one of the word lines. With respect to sub array 121, the select state of signal MB1_SEL is used to control whether bitline select modules 1211-1213 electrically connect their right (MBL1R-MBL3R) or left (MBL1L-MBL3) bitline interconnects to their corresponding higher-level bitline interconnects SBL1-SBL3. With respect to sub-array 122, the select state of signal MB2_SEL is connected to interconnect MBL_SEL to control whether bitline select modules 1211-1213 electrically connect their right (MBL1R-MBL3R) or left (MBL1L-MBL3) bitline interconnects to their corresponding higher-level bitline interconnects SBL4-SBL6. The select state of signals SB1_SEL and SB2_SEL are used to control whether the sub-array bitlines of sub-array module 121 or of sub-array module 122 are electrically connected to interconnects BL1-BL3. For convenience, a specific memory cell 9 of the memory array 12 can be referred to herein by reference to its sub array, row, and column. For example, memory cell 121/1/1R refers to memory cell 9 of sub-array 121 that is at the word line/bitline intersection that includes word line WL1_SEL and bitline MBL1R, and, therefore, is connected to both WL1_SEL and MBL1R.

In the specific embodiment herein, each memory cell 9 of memory 20 can be placed in one of two states in order to represent a single binary bit of information, though one skilled in the art will appreciate that other memory cells can be capable of being placed in three or more states, representing more information than is represented by a single binary bit.

During a read operation, storage state information that is based upon the program state of memory cell 9 will be communicated via a memory bitline to a sense amplifier in response to the memory cell 9 being selected by an appropriate select state at the control interconnect 40. For example, in response to memory cell 121/1/1R being selected, the program state of memory cell 121/1/1R will cause storage state information to be communicated to sense amplifier 111 via the memory bitline that includes memory cell bitline MBL1R (of sub-array 121), bitline select module 1211 (of sub-array 121), sub-array bitline SBL1, bitline select module 1261, and sense-amp bitline BL1. Similarly, in response to memory cell 122/2/3L being selected, the state of memory cell 122/2/3L will cause storage state information be communicated to sense amplifier 113 via a memory bitline that includes memory cell bitline MBL3L (of sub-array 122), bitline select module 1213 (of sub-array 122), sub-array bitline SBL6, bitline select module 1273, and sense-amp bitline BL3. In this manner, stored information is communicated from a cell 9 to one of the sense amplifiers 111-113 that determines a logic state based upon the signal at its respective bitline. It will be appreciated that more or fewer levels of bitline hierarchy can be implemented, and that the three levels illustrated at FIG. 1 merely represent a specific embodiment.

During a read operation, there may exist undesirable intermingling of information between various elements of array 12, such as between the memory cells 9 and various bitlines. Such undesired intermingling of information is also known as parasitic coupling and can include capacitive, inductive, and conductive effects. For purposes of discussion, it is assumed that information communicated from one selected memory cell 9 to its sense amplifier via its memory bitline is intermingled with information communicated over various other bitlines. Such intermingling of information is referred to as a cross-talk effect. The overall effect of such parasitic coupling at the memory bitline of a particular memory cell 9 can distort the stored information communicated from the memory cell prior to being received at the sense amplifier responsible for determining a logic of the communicated information.

In order to mitigate the effects of such cross-talk, better manufacturing and design techniques focused on improved physical isolation between bitlines have been used. In addition, techniques have been implemented using reference and data lines that are twisted in order to introduce noise at the reference line that matches the noise at the data line. This allows a difference amplifier to use common mode rejection mitigate the effect of noise at the output of the amplifier. However, it has been recognized by the inventor that though information contained in memory cells can vary from read-to-read, and as a result the information intermingled at bitlines due to cross talk varies accordingly, that the physical relationships amongst the bitlines that create undesired intermingling of information generally do not change, e.g., parasitic capacitances, inductances and conductances generally do not vary with time. Therefore, the physical relationships amongst the bitlines that result in the undesired crosstalk can be thought of as implementing a spatial filter that causes information to be intermingled among spatially separated interconnects in a systematic way. As discussed in greater detail below, by applying a spatial filter at a sense amplifier that is the mathematical inverse of the spatial filter that causes cross-talk, original information, such as the storage state information provided to a bitline by a memory cell, can be recovered from the intermingled information.

During a read operation, each sense amplifier of the sense amplifiers 111-113 is connected to a bitline interconnect for which it is responsible for determining a logic value of storage state information communicated over a memory bitline that includes that bitline interconnect. In addition, each sense amplifier of the plurality of sense amplifiers 111-113 is connected to two adjacent bitline interconnects for which it is not responsible for determining logic values. Sense amplifier 112 is connected to bitline interconnects BL1-BL3, and will determine a logic value of a memory cell connected to a memory bitline that includes bitline interconnect BL2, which is referred to as the center bitline interconnect of sense amplifier 112. The other two adjacent memory bitline interconnects, memory bitline BL1 and BL3, referred to as the outer memory bitline segments of sense amplifier 112, communicate information that is used by the sense amplifier 112 to compensate for a cross talk-effect at the center bitline BL2, which is being read. Therefore, FIG. 1 illustrates sense amplifiers 111-113, where during a read operation, each one of sense amplifiers 111-113 is connected to three adjacent memory bitlines that include a center memory bitline, and two outer memory bitlines.

The spatial relationship between the adjacent memory bitlines at a sense amplifier can vary by individual bitline interconnects of the memory bitlines based upon their respective hierarchy within their respective memory bitline. For example, assuming memory cell 121/1/L1 and memory cell 121/1/L2 are being read, sequentially numbered bitline interconnects, such as BL1 and BL2, that are at an upper-most level of bitline interconnects are immediately adjacent to each other, while memory cell bitlines MBL1L and MBL2L for the same memory bitline that are at a lower-most level of bitline interconnects are spaced apart from each other by memory cell interconnect MBL1R, assuming memory cell 121/1/L1 and memory cell 121/1/L2 are being read.

In engineering practice, a lumped parameter circuit model of memory 20, including cross-talk effects, can be constructed, given the specific detailed circuit topology, the physical dimensions of interconnects, the spacing between interconnects, the electrical properties of the materials that form the interconnects and the electrical properties of the materials in the spaces between interconnects. Such a circuit model can not only include the electrical elements of the intended signal paths, but can also include the unavoidable parasitic elements that result in the undesirable parasitic coupling that causes cross-talk between spatially separated signal paths. Such a model can be used to calculate the effect of each signal path on each other spatially separate signal path. That result enables further analysis to determine a mathematical function that describes how information is systematically intermingled between spatially separated signal paths due to cross-talk. Such a mathematical function may be referred to as a spatial filter. Given that spatial filter, it is further possible to determine a mathematical inverse function that may be referred to as an inverse spatial filter. Given information signals that have first been intermingled by a first spatial filter function, such as the spatial filter inherent in the physical construction of memory 20, it is possible to pass those signals through an inverse spatial filter to reverse the effect of cross-talk and recover original signal information.

One formulation of a spatial filter is described by the following mathematical function:

$$Y=[A1*X(j)]+[A2*X(j+1)] \ldots +[An*X(j+n)];$$

where, for an inverse spatial filter, Y is a value representing recovered original information at a particular bitline, X(j) through X(j+n) are voltage or current values representing information received from memory bitlines, such as memory bitlines BL1-BL3, whose relative spatial positions are identified with index numbers in the range j through j+n, and A1 through An are coefficients where n is equal to the number of memory bitlines in the memory to which the inverse spatial filter is to be applied. The symbol, *, represents multiplication. The symbol, +, represents addition. The effect of such a mathematical function is to adjust the value of Y according to values of X(j) through X(j+n), with the weighting and additive effect of each being determined by the signs and magnitudes of coefficients A1 through An. With appropriately defined values of A1 through An, the effect of intermingling of information among bitlines can be compensated such that the value of Y represents the original information at a given bitline.

In general, the calculation of the value of Y of Equation 1 is too complicated to evaluate at a memory device due to hardware costs or due to the time required to complete a calculation. One cause of complexity is that equation 1 can include as many terms as there are bitlines being read in the memory array during a read operation. Another cause of complexity is that some of the parasitic impedances that cause cross-talk may vary dependent on values of X(j) through X(j+n) and, therefore, the terms A1 through An may require adjustment as the values of X(j) through X(j+n) vary. Yet another cause of complexity is that the conductance of a memory cell can vary according to information stored, and the memory cell conductance interacts with the parasitic impedances that cause cross-talk, thereby causing cross-talk effects to vary as a function of information stored. Such information dependent cross-talk effects would make it impractical to accurately determine cross-talk effects and a corresponding inverse spatial filter function at the time of the design of a memory system.

However, it has been recognized by the inventor that there are properties of typical memory systems that enable simplification of the inverse spatial filter of Equation 1. First, in most memory systems, strong direct interactions between memory bitlines exist only between memory bitlines that are in close physical proximity. In fact, in many practical cases, the only significant direct interactions are between immediately adjacent bitlines. Consequently, Equation 1 can be simplified, whereby a preponderance of the coefficients A1 through An are likely to have values that may be approximated as zero for practical purposes, or that may be collected together as a single constant term, thereby making it unnecessary to evaluate products of those coefficients when determining the value of Y. Second, dependency of parasitic coupling impedances on values of X(j) through X(j+n) is very often small enough to be inconsequential for practical purposes. One reason is that parasitic coupling impedances often are dominated by mechanisms that are actually very nearly constant over the relevant range of values of X(j) through X(j+n). For example, capacitances between metal conductor interconnects typically are very nearly constant over the range of operating voltages of a memory array. Third, though, in general, memory cell conductances can vary as a function of the information stored in memory cells, said conductances tend to be small in magnitude relative to parasitic conductances that cause cross-talk. Therefore, variation in said memory cell conductances tends to be inconsequential because parasitic conductances tend to dominate. The resulting small variation of cross-talk behavior, due to variation of memory cell stored information, can be minor and easily tolerated in a practical system.

By applying one or more of the aforementioned simplifying factors that are present in many practical memory systems, Equation 1 can be simplified. In one simplification, where the physical design of bitlines results in significant coupling only between a bitline and two immediate neighbors, where parasitic conductances are approximately linear over the relevant operating range, and where memory cell conductances are small in magnitude relative to parasitic coupling, Equation 1 can be reduced to the following:

$$Y(k)=A0+[A1*X(k-1)]+[A2*X(k)]+[A3*X(k+1)] \qquad \text{Equation 2}$$

where Y(k) is a value representing recovered original information at a first bitline whose identifying index is k, X(k) is a voltage or current representing information at a first memory bitline whose identifying index is k, e.g., at memory bitline BL2, X(k−1) is a voltage or current representing information at a bitline adjacent to the first bitline, e.g., at memory bitline BL1, and X(k+1) is a voltage or current representing information at the other bitline adjacent to the first bitline, e.g., at memory bitline BL3. A1 through A3 are constant coefficients and A0 is a constant whose value is a sum of any of the terms of Equation 1 that may be characterized as substantially constant for practical purposes.

Figure 2:
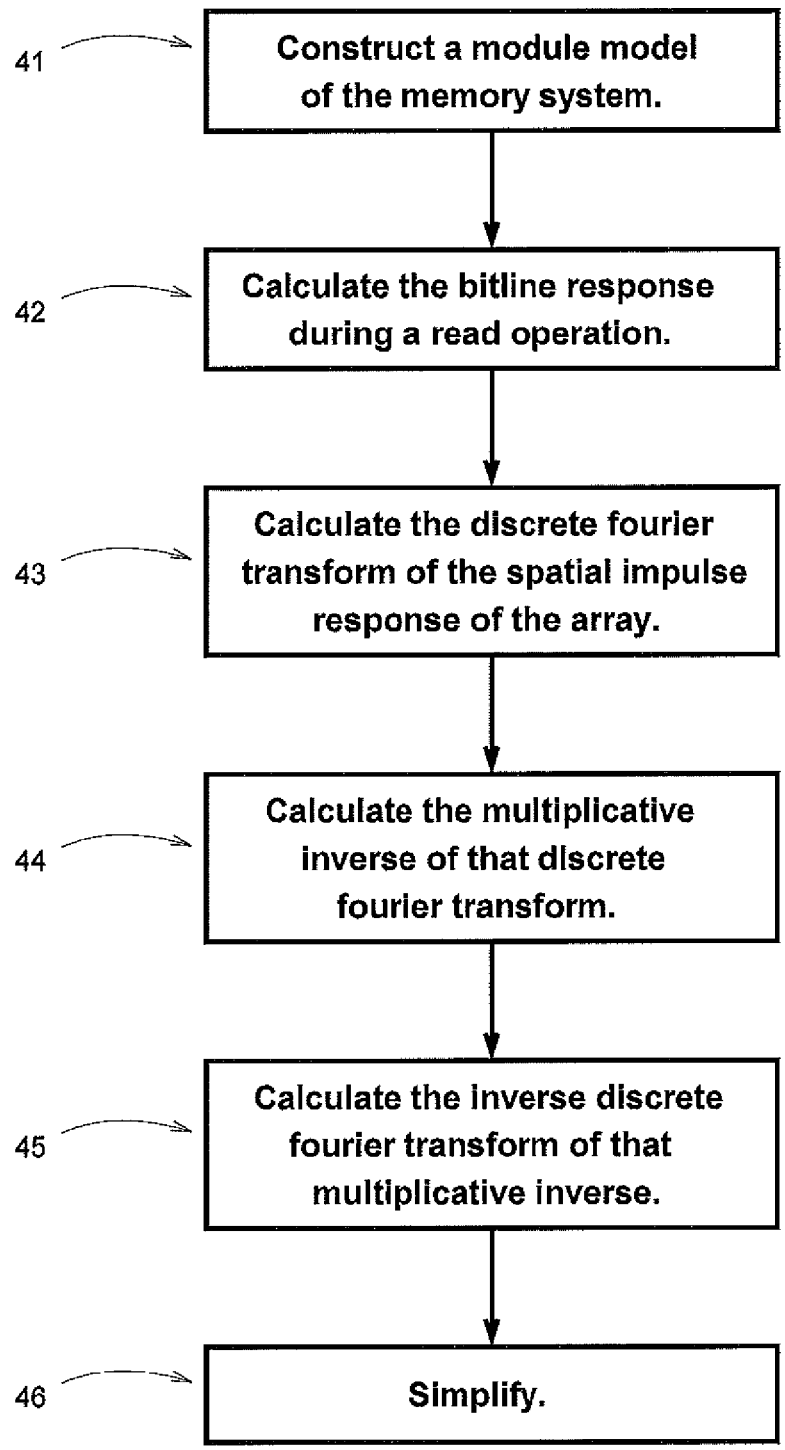
FIG. 2 illustrates in flow diagram form one embodiment of a method in accordance with the present disclosure.

The method of FIG. 2 can be used to determine coefficient values, A0 through An in Equation 2, that define an inverse spatial filter for compensation of cross-talk in a memory system. It will be appreciated by one of ordinary skill in the art that the inverse spatial filter of a sense amplifier used to determine a storage state of a memory cell at a particular bitline is only based upon the physical relationship amongst the bitline being read and the two bitlines adjacent to the bitline being read.

At node 41, a model of the memory system 20 is constructed that includes memory cells and any parasitic elements that may cause cross-talk in the memory array. The model also includes the ability to represent information stored in memory cells in the memory array. In one embodiment, only those parasitic components associated with immediately adjacent memory bitlines are modeled in order to simplify the calculation. One tool that can be used to model such a memory system is SPICE, from the University of California at Berkeley, or one of many commercial or open-source SPICE derivatives.

At node 42, the bitline response of the memory is calculated using the model constructed at node 41. The bitline response can be determined by reading one memory cell connected to the bitline whose stored information represents one logical state and the remaining bitlines reading memory cells whose stored information represents another logical state. The bitline levels so calculated represent the spatial impulse response of the array.

At node 43, the discrete Fourier transform of the spatial impulse response of the array is determined. For example, such a calculation can be done using an open source matrix math tool such as Octave, or a similar commercial tool.

At node 44, the multiplicative inverse of the discrete Fourier transform calculated at node 43 is calculated.

At node 45, the inverse discrete Fourier transform of the multiplicative inverse calculated at node 44 is calculated. The result of the inverse discrete Fourier transform is a list of coefficient values, A1 through An, that define the inverse filter function for cross-talk compensation.

At node 46, arithmetic simplifications may be performed to minimize the number of terms that are evaluated in the inverse filter equation. For example, any constant terms, or approximately constant terms, may be collected into an A0 term as illustrated in the example of Equation 2.

In the particular embodiment of the disclosure that is illustrated in FIG. 1, each sense amplifier of the plurality of sense amplifiers is connected to three spatially separated interconnects comprising three adjacent sense amplifier bitlines in a manner consistent with the example of Equation 2. For example, to provide the correct logic information stored at memory cell 2/2/2L at the output DO2 of sense amplifier 112, sense amplifier 112 receives information via a center memory bitline connected to memory cell 2/2/2L and from two adjacent memory bitlines connected to memory cells 2/2/1L and 2/2/3L. Application of an inverse spatial filter removes a significant portion of undesired cross-talk received at the center bitline of sense amplifier 112 to provide a more reliable logic state at the output of sense amplifier 112 than if the adjacent memory bitline information was not used.

Figure 3:
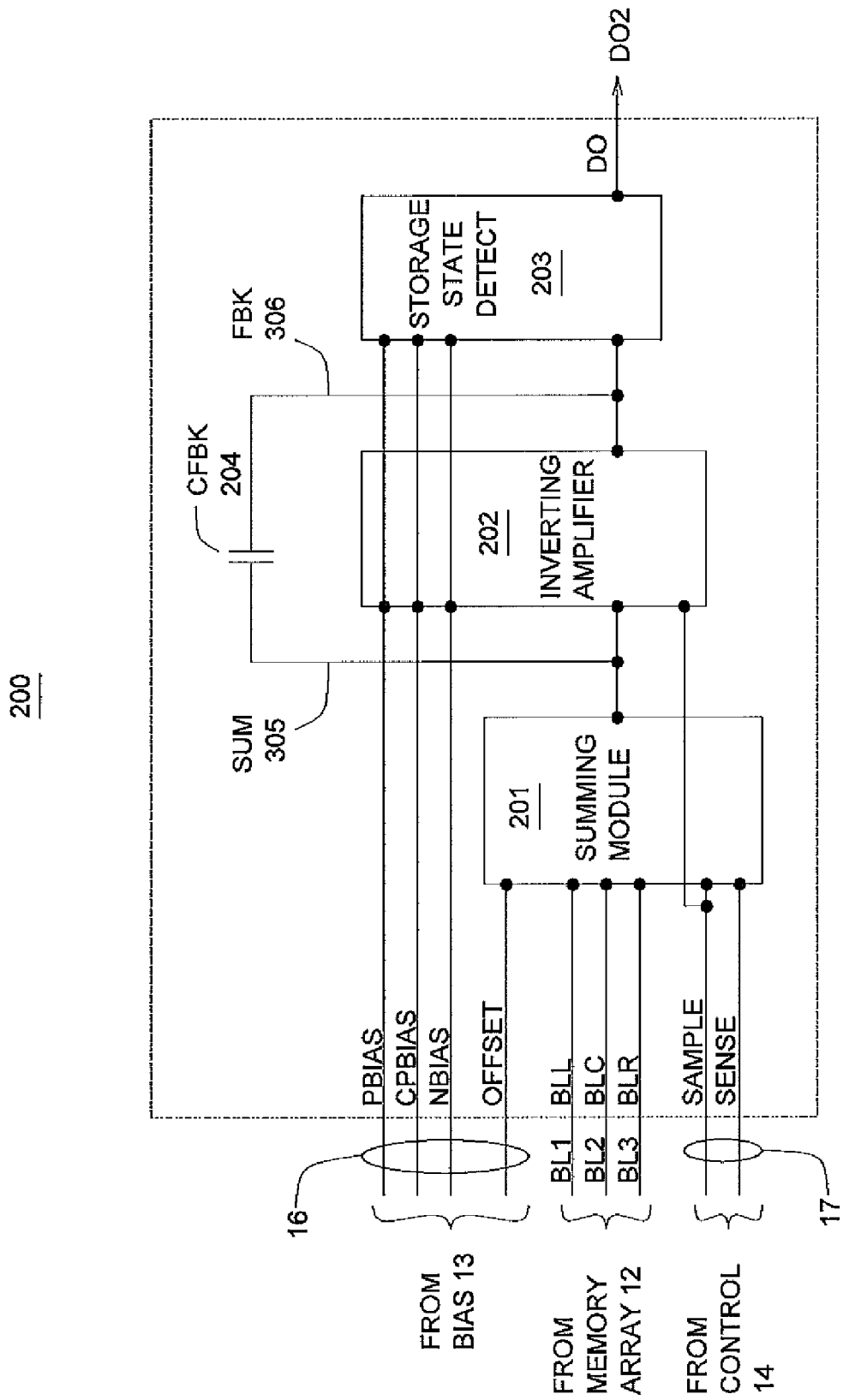
FIG. 3 illustrates in block diagram form one embodiment of a sense amplifier in accordance with the present disclosure.

FIG. 3 illustrates in block diagram form a sense amplifier 200 that represents a specific embodiment of a sense amplifier that can be implemented as instances of sense amplifiers 111-113. Sense amplifier 200 of FIG. 3 is particularly illustrated as the instantiation of sense amplifier 112. Sense amplifier 200 comprises a summing module 201, an inverting amplifier 202, a storage state detect module 203, a capacitor 204 that is also labeled CFBK, and various interconnects as discussed below.

Interconnects PBIAS, CPBIAS, NBIAS, and OFFSET of sense amplifier 200 are connected to corresponding interconnects of interconnect 16 of FIG. 1 of the same name (not shown at FIG. 1). Interconnects SAMPLE and SENSE of sense amplifier 200 are connected to corresponding interconnects of interconnect 17 of FIG. 1 of the same name (not shown at FIG. 1). Interconnects BLL, BLC, and BLL of sense amplifier 200 are connected to interconnects BL1, BL2, and BL3 of FIG. 1, respectively.

Summing module 201 includes terminals connected to interconnects OFFSET, BLL, BLC, BLR, SAMPLE, SENSE, and SUM. Inverting amplifier 202 includes terminals connected to interconnects PBIAS, CPBIAS, NBIAS, SAMPLE, FBK and SUM. Storage state detect module 203 is connected to interconnects PBIAS, CPBIAS, NBIAS, FBK, and DO. Capacitor 204 is connected to interconnects SUM and FBK.

During a read operation, sense amplifier 200 receives bias signals and data signals. Bias signals are received at interconnects PBIAS, CPBIAS, NBIAS and OFFSET, and data signals are received at the interconnects BLL, BLC, and BLR of sense amplifier 200. For purposes of discussion, the bias and data signals are presumed to be voltages during read operation, where the bias signals are constant voltages. Interconnect BLC of sense amplifier 200 receives signal information that includes storage state information from a memory cell that is to be read by the sense amplifier 200 and cross-talk. Interconnect BLL of sense amplifier 200 receives signal information that includes storage state information from a memory cell being read by a sense amplifier other than sense amplifier 200 and cross-talk. Interconnect BLR of sense amplifier 200 receives signal information that includes a signal representing storage state information from a memory cell being read by a sense amplifier other than sense amplifier 200 and cross-talk.

During a read operation, the summing module 201 provides a signal to interconnect SUM that is a weighted sum of the signals BLL, BLC, BLR and OFFSET. The weighting amongst the signals BLL, BLC, BLR is generally based upon the design characteristics of the memory 20 that results in undesirable cross-talk. The weighting characteristic of the OFFSET signal is generally based upon the design characteristics of the memory 20 that results in undesirable cross-talk, and based upon the storage state characteristics of the memory cell. With respect to the specific example discussed herein, the signal received at terminal BLC is presumed to be given a relatively greater weight (a scaling factor with a greater magnitude) than the signals received at terminals BLL and BLR. In addition, the sign of the weight applied to signal BLC is the opposite of the weights given to BLL and BLR.

Further, the OFFSET signal is presumed to have a weight that is significantly smaller than the weights of BLL and BLR while having a sign that is the same as BLL and BLR. In general, the value of OFFSET is the value of filter parameter A0 in Equation 1. However, the OFFSET value may include additional adjustments for other purposes. Such purposes may include compensation for non-ideal transistor characteristics, power supply noise that can affect sense-amplifier performance, and to support detecting the storage state of a memory cell having more than two storage states. For example, a non-binary mode of memory cell operation, such as is commonly used to store data in high density NAND flash products, would benefit from the varying of the value of OFFSET. In that case, OFFSET would be given one value to read one range of cell information and a different value to read another range of cell information, while leaving all other inputs and weightings constant. The signal provided to interconnect SUM charges capacitor 204 and the input of inverting amplifier 202.

Acting in concert with capacitor 204, inverting amplifier 202, receives the signal at interconnect SUM and amplifies it to generate a signal at interconnect FBK. The amount of amplification implemented by inverting amplifier 202, in concert with capacitor 204, is based upon the design characteristics of memory 20 that results in the undesirable cross-talk to be removed by the inverse spatial filter being implemented at sense amplifier 200. Therefore, capacitor 204 acts in concert with the summing module 201 and the inverting amplifier 202 to implement a summing amplifier that acts as an inverse spatial filter to the design characteristics of the memory, such as the physical relationships amongst the bitlines that produce the undesirable crosstalk. The signal FBK, as modified by inverting amplifier 202 and summing circuit 201 across capacitor 204, includes a representation of a signal corresponding to the storage state information provided by the memory cell being read. The signal FBK can be an intermediate signal used by storage state detect module 203 to determine a logic-level output signal DO that corresponds to the state of the memory cell being read.

The relationship between inverse spatial filter parameters and details of the specific embodiment described herein at Equation 2 can be algebraically rearranged as shown in Equation 3.

$$Y(k) = A1 * \{A0/A1 + X(k-1) + [A2/A1 * X(k)] + [A3/A1 * X(k+1)]\} \quad \text{Equation 3}$$

For a specific embodiment of a memory 20, having a coupling capacitance of 10 pico-farad between immediately adjacent sense-amp bit-lines, 1 pico-farad parasitic capacitance from each sense-amp bit-line to ground, a bitline resistance of 10K ohms between a cell 9 and a sense-amp bitline, a cell 9 resistance from a bitline to ground of 500K ohms representing a first information state or 100 Meg-ohm representing a second information state, having 1 Volt established initially at each memory bitline, allowing 0.5 micro-second for said cells 9 to generate voltage signals at said memory bitlines during a SAMPLE period, assigning to $Y(k)$ the voltage value at interconnect FBK, assigning to $X(k-1)$ the voltage value at BLL, assigning to $X(k)$ the voltage value at BLC, assigning to $X(k+1)$ the voltage value at BLR, and assigning to A0 the voltage value at OFFSET, the terms of Equation 3 would be approximately as follows:

A0=0.86 Volt, the OFFSET value.

A1=−16, the gain factor of inverting amplifier 202 in concert with 201 and 204.

A2/A1=−2.158, the weight of signal BLC relative to BLL.

A3/A1=1, the weight of signal BLR relative to BLL.

At the end of a read operation, given the above parameters, the resulting signal at FBK rests at approximately its quiescent point when a selected cell 9 has said first information state. FBK attains a level approximately 1 Volt higher when a selected cell 9 has said second information state. However, depending on variation in transistor characteristics and environmental factors, storage state detect module 203 may have an indeterminate output when FBK is at its quiescent level. In practice, this limitation of storage state detect module 203 and the system can be corrected by means of a minor adjustment of the value of A0 to favor the otherwise problematic state. For example, adding 100 milli-volts to OFFSET, A0, to make it 0.96 V instead of 0.86 V, is usually sufficient to accommodate typical transistor variation and enable storage state detect module 203 to perform reliably irrespective of transistor variation. Also, it should be apparent that cell 9 information states between 500K ohms and 100 Meg ohms can be accommodated by further adjustment of the values of OFFSET, A1, A2/A1, A3/A1, as appropriate to attain desired inverse spatial filter performance with alternate definitions of cell 9 information states. In general, a narrower range between cell 9 information states can be expected to result in an inverse spatial filter with a larger value of gain, A1. Also, generally, cell 9 information states having higher conductances can be expected to require a higher value or weighting of OFFSET A0 relative to the other coefficients.

Figure 4:
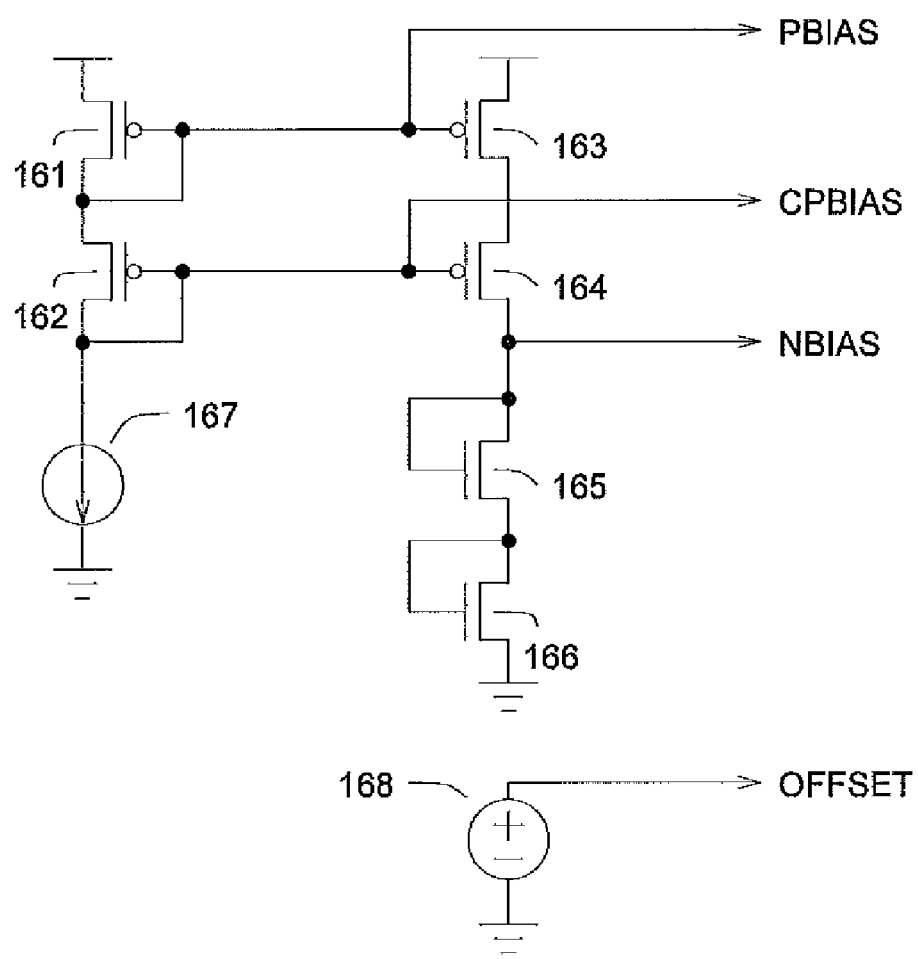
FIG. 4 illustrates in schematic form a bias module compatible with one embodiment of the present disclosure.

FIG. 4 shows a specific implementation of bias module 13 in schematic form. Bias module 13 comprises p-channel transistors 161, 162, 163 and 164, n-channel transistors 165 and 166, current sink 167 and voltage source 168. Transistor 161 has a source connected to VDD, a gate connected to PBIAS, and a drain connected to PBIAS. Transistor 162 has a source connected to PBIAS, a drain connected to CPBIAS, and a gate connected to CPBIAS. Current source 167 has a first current terminal connected to CPBIAS, and a second current terminal connected to ground. Transistor 163 has a source connected to VDD, a gate connected to PBIAS, and drain. Transistor 164 has a source connected to the drain of transistor 163, a gate connected to CPBIAS, and a drain connected to NBIAS. Transistor 165 has a gate connected to NBIAS, and a drain connected to NBIAS, and a source. Transistor 166 has a gate connected to the source of transistor 165, a drain connected to the source of transistor 165 and a source connected to ground.

In operation, current source 167 conducts a current of a pre-determined magnitude from CPBIAS, to ground. The pre-determined magnitude may be from a fraction of a micro-amp to as much as several tens of micro-amps, depending on specific performance goals of a particular implementation. For one particular embodiment, the current level is three micro-amps. The current through current source 167 also results in a current flowing through transistors 161 and 162, thereby establishing stable voltages at PBIAS, and CPBIAS. The PBIAS, and the CPBIAS voltages are applied to the gates of transistors 163 and 164, respectively, causing transistors 163-166 to conduct current, which causes NBIAS to be established at a stable voltage level. Voltage source 168 provides a stable voltage at OFFSET independent of the voltages of PBIAS, CPBIAS, and NBIAS. In the illustrated embodiment there is one bias module 13 module interconnected with a multiplicity of sense amplifier 300 instances, though in other embodiments there can be multiple bias modules 13, such as one bias module 13 for each sense amplifier 300.

Figure 5:
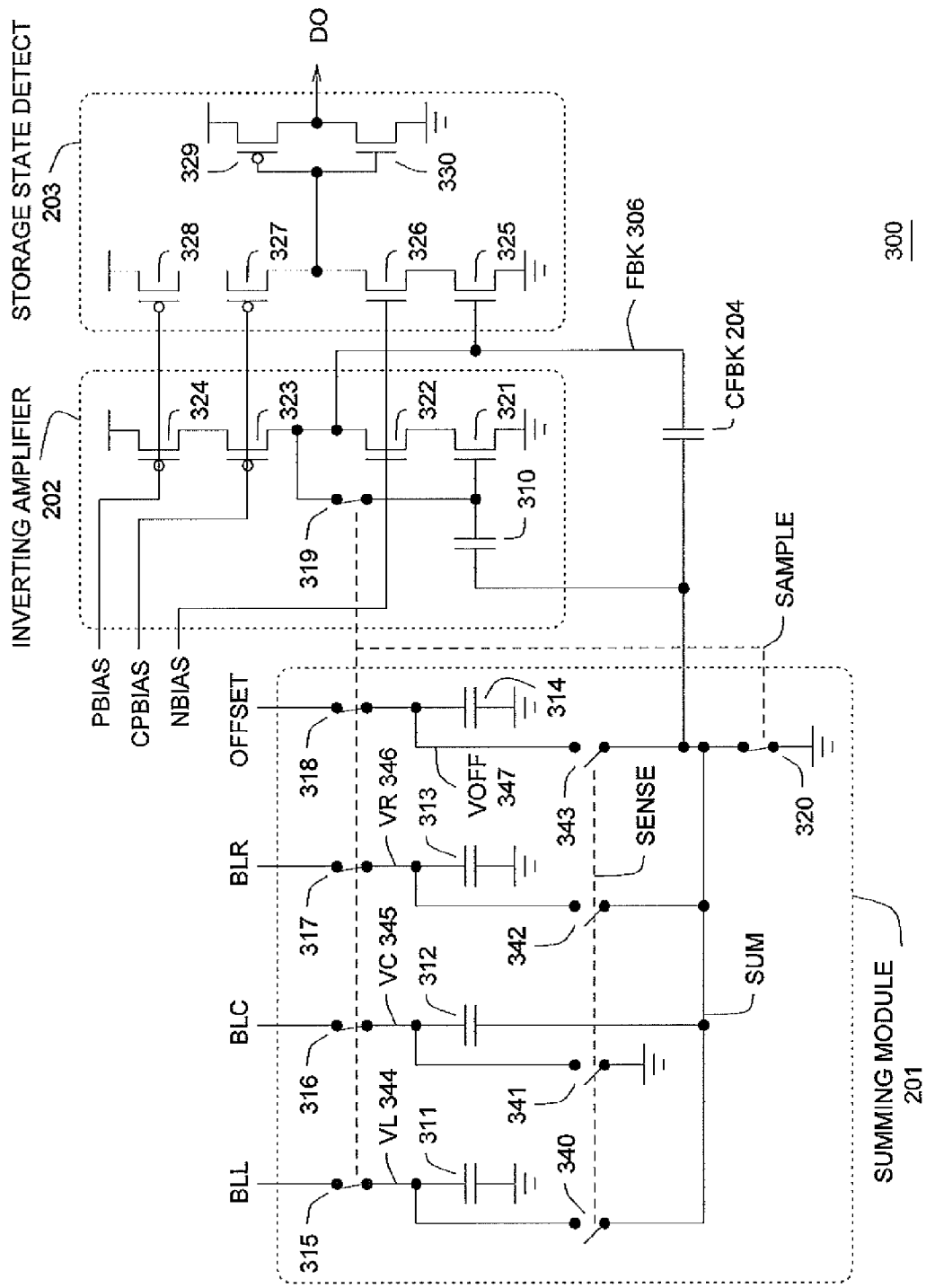
FIG. 5 illustrates in schematic form one embodiment of a sense amplifier in accordance with the present disclosure, with references to FIG. 3.

FIG. 5 illustrates in schematic form a specific embodiment of sense amplifier 300, which can be a specific embodiment of sense amplifier 200 of FIG. 3. Sense amplifier 300 comprises switches 315, 316, 317, 318, 319, 320, 340, 341, 342 and 343, capacitors 204, 310, 311, 312, 313 and 314, p-channel transistors 323, 324, 327, 328 and 329 and n-channel transistors 321, 322, 325, 326 and 330.

Interconnect BLL is connected to a first data terminal of switch 315. A second data terminal of switch 315 is connected to a first terminal of capacitor 311 and a first data terminal of switch 340. A second terminal of capacitor 311 is connected to ground. Interconnect BLC is connected to a first data terminal of switch 316. A second data terminal of switch 316 is connected to a first terminal of capacitor 312 and a first data terminal of switch 341. A second data terminal of switch 341 is connected to ground. Interconnect BLR is connected to a first data terminal of switch 317. A second data terminal of switch 317 is connected to a first terminal of capacitor 313 and a first data terminal of switch 342. A second terminal of capacitor 313 is connected to ground. Interconnect OFFSET is connected to a first data terminal of switch 318. A second data terminal of switch 318 is connected to a first terminal of capacitor 314 and a first data terminal of switch 343. A second terminal of capacitor 314 is connected to ground. Interconnect SUM is connected to a second data terminal of switch 340, a second terminal of capacitor 312, a second data terminal of switch 342, a second data terminal of switch 343, a first data terminal of switch 320, a first terminal of capacitor 310 and a first terminal of capacitor 204, which corresponds to commonly labeled capacitor 204 of FIG. 3. A second terminal of capacitor 310 is connected to a first data terminal of switch 319 and the gate of transistor 321. A second data terminal of switch 319 is connected to the drain of transistor 323, the drain of transistor 322, the gate of transistor 325 and a second terminal of capacitor 204. Transistor 324 has a gate connected to PBIAS, a source connected to VDD and a drain. Transistor 323 has a gate connected to CPBIAS, a source connected to the drain of transistor 324, and a drain connected to interconnect FBK. Transistor 321 has a drain connected to the source of transistor 322, a source connected to ground and a gate. Transistor 322 has a source connected to the drain of transistor 321, a drain connected to interconnect FBK 306 and a gate connected to NBIAS. Transistor 325 has a gate connected to FBK 306, a source connected to ground and a drain. Transistor 326 has a gate connected to NBIAS, a source connected to the drain of transistor 325 and a drain. Transistor 327 has a gate connected to CPBIAS, a drain connected to the drain of transistor 326 and a source. Transistor 328 has a gate connected to PBIAS, a source connected to VDD and a drain connected to the source of transistor 327. Transistor 330 has a gate connected to the drain of transistor 326, a source connected to ground and a drain connected to DO. Transistor 329 has a gate connected to the drain of transistor 326, a source connected to VDD and a drain connected to DO. Interconnect SAMPLE is connected to the enable inputs of switches 315-320. Interconnect Sense is connected to the enable input of switches 340-343.

During operation, switches 315, 316, 317, 318, 319 and 320 are conductive when control signal SAMPLE is asserted, and are non-conductive when control signal SAMPLE is de-asserted. Switches 340, 341, 342 and 343 are conductive when control signal SENSE is asserted, and non-conductive when control signal SENSE is de-asserted. The switches illustrated in FIG. 5 are shown in the state they would be in with SAMPLE asserted and SENSE de-asserted, which corresponds to a first portion of a read operation of the sense amplifier 300.

With SAMPLE asserted and SENSE de-asserted, the voltage VL at capacitor 311 is equal to the voltage at BLL, the voltage VC at capacitor 312 is equal to the voltage at BLC, the voltage at VR at capacitor 313 is equal to the voltage at BLR, the voltage at VOFF is equal to the voltage at OFFSET and the voltage at SUM is equal to the voltage at ground. Further, the voltage at the gate of transistor 321 is equal to the voltage at FBK in response to the switch 319 being conductive.

With SAMPLE asserted, the voltage at FBK settles to the natural quiescent point of the amplifier formed by transistors 321, 322, 323 and 324. The natural quiescent point is dependent on transistor characteristics and voltage levels of PBIAS, CPBIAS and NBIAS. In an embodiment, transistors 321 of inverting amplifier 202, and transistor 325 of storage state detect module 203 are similar to each other, e.g., matched transistors, transistors 322 and 326 are similar to each other, transistors 323 and 327 are similar to each other, and transistors 324 and 328 are similar to each other. Further, transistors 324 and 328 are similar to transistor 161 of BIAS 160, transistors 323 and 327 are similar to transistor 162 of BIAS 160, transistors 322 and 326 are similar to transistor 165 of BIAS 160 and transistors 321 and 325 are similar to transistor 166 of BIAS 160.

With such similarity between groups of transistors, and with the gate of transistor 325 connected to FBK as shown in FIG. 5, the stable voltage established at the drains of transistor 327 and transistor 326 is similar to the voltage at interconnect FBK 306. Said stable voltage is also the gate voltage of transistors 329 and 330. A stable voltage at DO is determined by the physical characteristics of transistors 329 and 330 and voltage at interconnect FBK and may be stable at any level between VDD and ground while SAMPLE is asserted.

A first portion of the read operation at sense amplifier 300 ends when SAMPLE is de-asserted, resulting in switches 315, 316, 317, 318 319 and 320 becoming non-conductive. Immediately after de-assertion of SAMPLE, sense amplifier 300 voltages remain at substantially the same voltages that existed immediately prior to de-asserting SAMPLE, altered only by a small amount of charging or dis-charging that may be caused by switches whose characteristics are not ideal. Said sense amplifier voltages are allowed to float, substantially unchanged, until a second portion of the read operation begins.

To enter a second portion of the read operation, SENSE is asserted, causing switches 340, 341, 342 and 343 to become conductive. In summing module 201, a conductive path from capacitors 311, 312, 313 and 314 to SUM is formed. Charge on capacitors 311, 313 and 314 acts to add charge to the signal SUM, while charge on capacitor 312 acts to subtract charge from signal SUM. Due to the coupling of SUM to inverting amplifier 202 through capacitor CFBK 204, the voltage at SUM is controlled to a level near ground. If net charge transferred from capacitors 311, 312, 313 and 314 is such that SUM tends to be discharged to below ground voltage, inverting amplifier 202 responds by driving interconnect FBK to a voltage above its natural quiescent point which transfers charge to SUM through capacitor CFBK 204. Said charge transfer continues until SUM is restored to approximately ground voltage, which is the voltage of SUM established at the end of a first portion of sense amplifier 300 operation. Similarly, if net charge transferred from capacitors 311, 312, 313 and 314 is such that SUM tends to charge above ground voltage, inverting amplifier 202 responds by driving the voltage at FBK to a voltage below its natural quiescent point, which transfers charge off of SUM through capacitor 204. Said transfer continues until SUM is restored to approximately ground voltage. A person skilled in the art will recognize that inverting amplifier 202 is presumed to have sufficient voltage gain to reliably respond to charge added to or subtracted from SUM and thereby maintain SUM near ground potential.

Therefore, amplitude of the voltage response at interconnect FBK is proportional to the amount of charge available at SUM resulting from connection of capacitors 311, 312, 313 and 314 through switches in response to assertion of SENSE, and inversely proportional to the capacitance value of capacitor 204. One skilled in the art will also understand that the charge available at SUM is proportional to voltages at BLL, BLC, BLR and OFFSET, and proportional to the capacitance values of capacitors 311, 312, 313 and 314. Further, it will be understood that the effect of a capacitor such as capacitors 311-314 can be made additive or subtractive with respect to net charge available at SUM when SENSE is asserted and SAMPLE is de-asserted. For example, given positive voltages at BLL, BLC, BLR and OFFSET, the charging effect of capacitor 312 is subtractive at SUM while the charging effects of capacitors 311, 313 and 314 are additive at SUM.

In one embodiment of sense amplifier 300, the voltages at BLL, BLC, BLR represent memory cell information that is binary. In response, a voltage is established at interconnect FBK that is substantially above the natural quiescent voltage of inverting amplifier 202 for memory cell information corresponding to one binary state, (logic HIGH or LOW) and substantially below the natural quiescent voltage of inverting amplifier 202 for memory cell information corresponding to the other binary state.

When the voltage at FBK is above its natural quiescent point, transistor 325 conducts more strongly which discharges its drain toward ground. Discharge of the drain of transistor 325 causes transistor 326 to conduct more strongly which causes the drain of transistor 326 to also discharge toward ground. As the drain of transistor 326 approaches ground, transistor 329 conducts more heavily and transistor 330 conducts less. Interconnect DO is driven to a power supply voltage, VDD, as the voltage at the drain of transistor 326 drops low enough to drive transistor 330 near its cutoff point. When the voltage of FBK is above its natural quiescent point, transistor 325 conducts less strongly which allows its drain to charge to a higher voltage through transistors 327 and 328. As the voltage at the drain of transistor 326 rises, transistor 330 conducts more heavily and transistor 329 conducts less heavily. As the voltage at the drain of transistor 326 approaches VDD, transistor 329 reaches its cutoff point and interconnect DO goes to ground. A ground voltage at interconnect DO corresponds to one binary state of information stored in a memory cell, while a VDD voltage at interconnect DO corresponds to the other binary state of information stored in a memory cell.

The size of capacitor CFBK 204 is chosen to produce sufficient amplitude of the voltage signal at FBK to cause DO to be driven to ground or VDD depending on the binary state of storage state information represented by the voltage at BLC.

In one embodiment, a spatial filter having aforementioned values for coefficients A0, A1, A2/A1 and A3/A1 in equation 3 can be implemented using the following capacitor values:

Capacitor 311 and Capacitor 313=1 picofarad,
Capacitor 312=2.158 picofarad,
Capacitor 314=0.0625 picofarad,
Capacitor 204=0.0625 picofarad.

A person skilled in the art will recognize that one property of the capacitor values is that their absolute values should be large relative to parasitic capacitances associated with transistors and interconnect within sense amplifier 300 in order to ensure that said parasitic capacitances do not introduce substantial error relative to the intended behavior of sense amplifier 300. A person skilled in the art will also recognize that the ratio of each capacitor's size relative to other capacitors is a primary determinant of performance of sense amp 300. Given those considerations, it will be understood that absolute values of capacitors in sense amplifier 300 can be larger or smaller than the example values without substantially affecting sense amplifier 300 performance, if the capacitor value ratios are as dictated by the spatial filter requirements and capacitor absolute values are large enough to dominate over any effects of parasitic capacitances in sense amp 300. A person skilled in the art will also recognize that the value of capacitor 310 is not a primary factor in determining spatial filter coefficients, since its purpose is primarily to capacitively couple the SUM signal to the gate of transistor 321. However, even for such a purpose, it is desirable that the capacitor value be large relative to the parasitic capacitance of the transistor gate and interconnect, to avoid excessive attenuation of the signal at the gate of transistor 321. In one embodiment of sense amp 300, the value of capacitor 310 is 0.1 picofarad.

Figure 6:
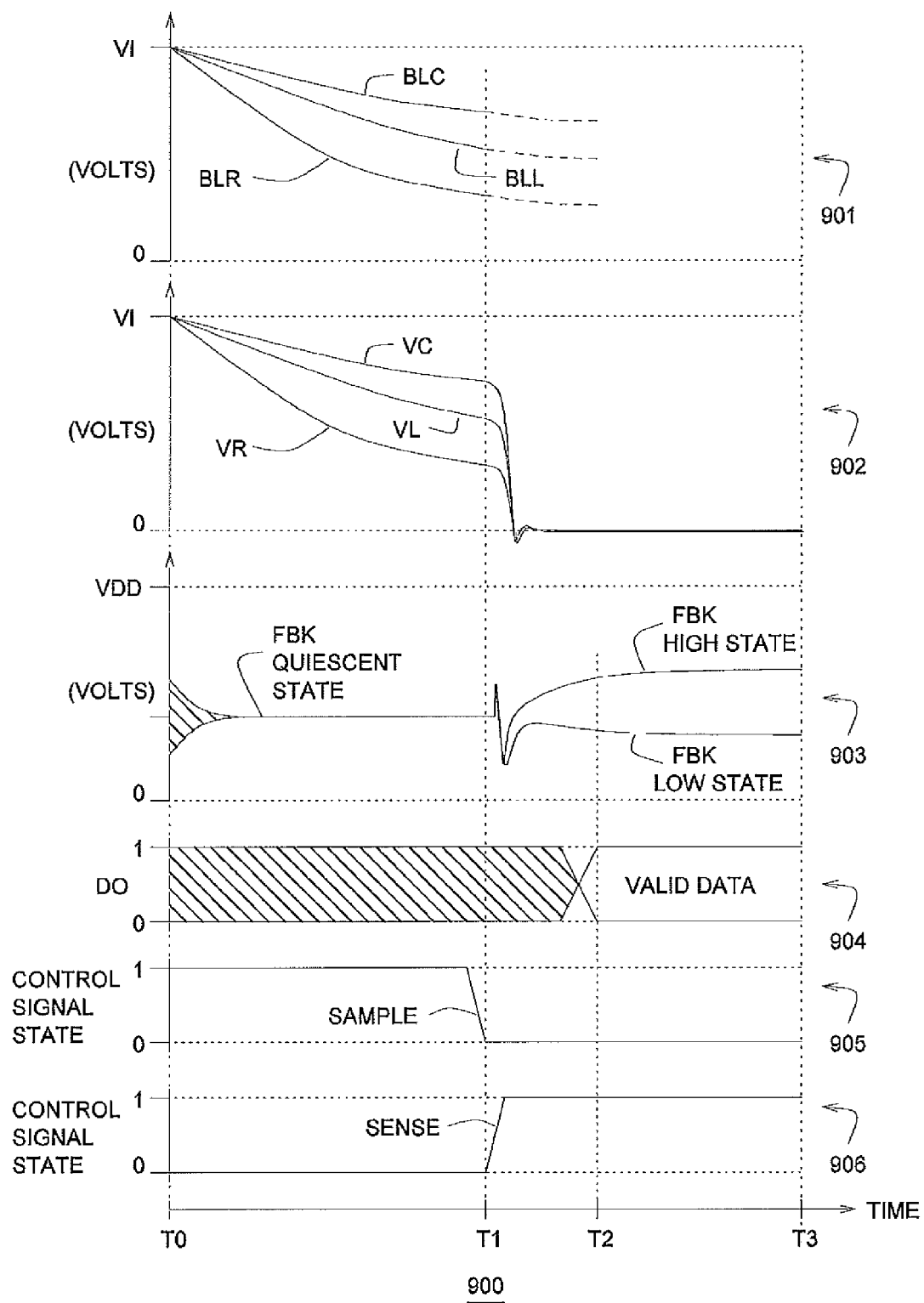
FIG. 6 illustrates in timing diagram form various signals associated with the operation of the sense amplifier of FIG. 5.

FIG. 6 illustrates in timing diagram form the operation of the module of FIG. 5. Timing diagram 900 comprises a plot 901 illustrating voltages of bitlines 30, a plot 902 illustrating corresponding capacitor voltages VR, VC and VL, a plot 903 illustrating voltages at FBK, a plot 904 illustrating the output signal DO, a plot 905 illustrating SAMPLE logic state and a plot 906 illustrating SENSE logic state. The horizontal axis of all plots represents time, with T0 being an initial time representing the beginning of a first portion of a read operation, T1 being the end of a first portion of the read operation and the beginning of a second portion of the read operation, T2 being a time when the output signal DO represents valid data and T3 being the end of the second portion of operation.

Prior to time T0, control signal SAMPLE is asserted and it remains asserted until it is de-asserted immediately prior to T1. Prior to time T0, control signal SENSE is de-asserted and it remains de-asserted until T1. At time T0, array circuitry (not shown) transitions from holding bitlines at the initial voltage, VI, to allowing bitlines to change voltage under the influence of memory cells, according to stored states of those cells. Therefore, the sense-amp bitlines BLL, BLC, and BLR gradually begin to gradually discharge based upon the storage state of corresponding memory cells that are being read and by the influence of cross-talk. Likewise, capacitor voltages VL, VC and VR discharge, very closely following the discharge of bitline levels BLL, BLC and BLL respectively. Voltage at FBK 306 approaches and becomes established at its natural quiescent state. The signal value at output DO remains indeterminate. SAMPLE remains asserted until a short time prior to T1, at which time it begins to transition to its de-asserted state.

At time T1, SAMPLE is fully de-asserted and, after the start of time T1, SENSE is asserted. In response to assertion of SENSE, capacitor voltage VC is electrically connected to ground, and capacitor voltages VL and VR are electrically connected to the SUM node, which is maintained near ground as discussed above. FBK 306 transitions toward a voltage representative of a logic state of the memory cell being read. The higher possible voltage of FBK 306 is referred to as the voltage FBK HIGH STATE, and the lower possible voltage of FBK 306 is referred to as the voltage FBK LOW STATE. At time T2, the voltage at FBK has sufficiently closely approached one or the other of the voltage FBK HIGH STATE or the voltage FBK LOW STATE to assure that output DO has a state that is a valid binary representation of information from a selected memory cell 9 of ARRAY 12. The state of FBK and VALID DATA are maintained at least until time T3. One skilled in the art will appreciated that subsequent to time T3 that signals SAMPLE and SENSE are asserted and de-asserted, respectively, prior to the time T0 of the next read operation. Similarly, the bitline levels BLL, BLC, and BLR return to the initial voltage V1 prior to time T0 of the next read operation.

Figure 7:
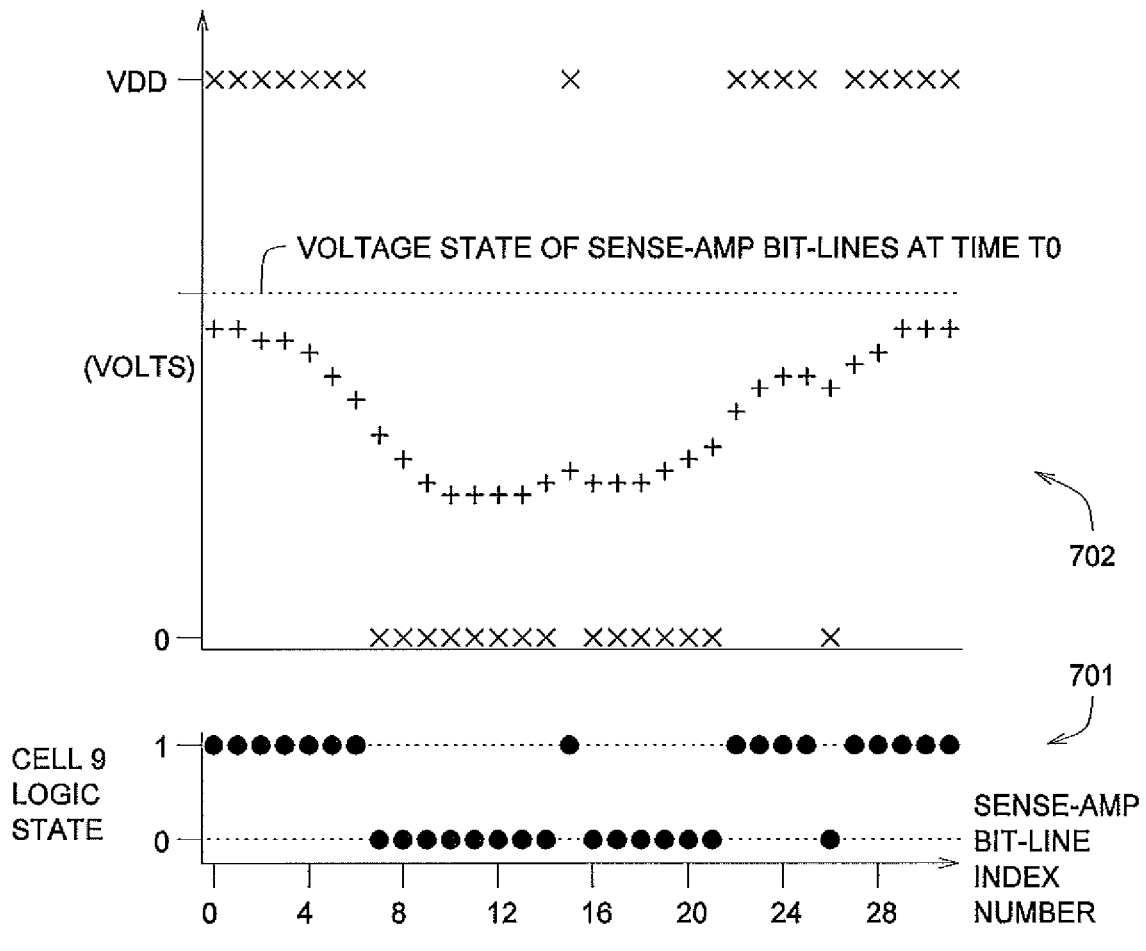
FIG. 7 is a graphical representation of an example performance of a group of sense amplifiers in accordance with the present disclosure, in a memory system that has cross-talk between bitlines.

Graph 700 of FIG. 7 represents the performance of a group of sense amplifiers in a memory system that has cross-talk between bitlines in accordance with the present disclosure. Graph 700 represents the behavior of a group of 32 sense amps and comprises graph 701 and 702. Graph 701 illustrates the binary logic states, 1 or 0, of information stored in selected memory cells 9 connected to sense-amp bitlines being read. For example, memory cells connected to bitlines 0-6 are at a state representative of a logic HIGH, while memory cells connected to bitlines 7-14 are at a state representative of a logic LOW. Graph 702 illustrates voltage levels at sense-amp bitlines at time T1 and voltages at corresponding output terminals DO at time T2 that correspond to the information stored at the memory cells 9. The horizontal axis shows index numbers for identification of individual sense-amp bitlines 0-31. Within graph 702, points representing a voltage state of a sense-amp bitline at time T1 illustrate an effect of strong cross-talk between immediately adjacent sense-amp bitlines, as indicated by the voltage state at any one sense-amp bitline at time T1 differing from a voltage state of another sense-amp bitline at time T1. However, points representing the voltage state at the output of the sense amplifiers at TIME T2 illustrate performance of sense amplifiers according to the present disclosure. For each sense-amp INDEX NUMBER, a clear correspondence exists between points representing a LOGIC STATE of a memory cell and points representing a determined logic at time T2, despite a strong cross-talk effect at sense-amp bitlines. For each CELL 9 LOGIC STATE illustrated as 1, a VOLTAGE STATE OF DO AT TIME T2 is illustrated as VDD. For each CELL 9 LOGIC STATE illustrated as 0, a VOLTAGE STATE OF DO AT TIME T2 is illustrated as 0.

Figure 8:
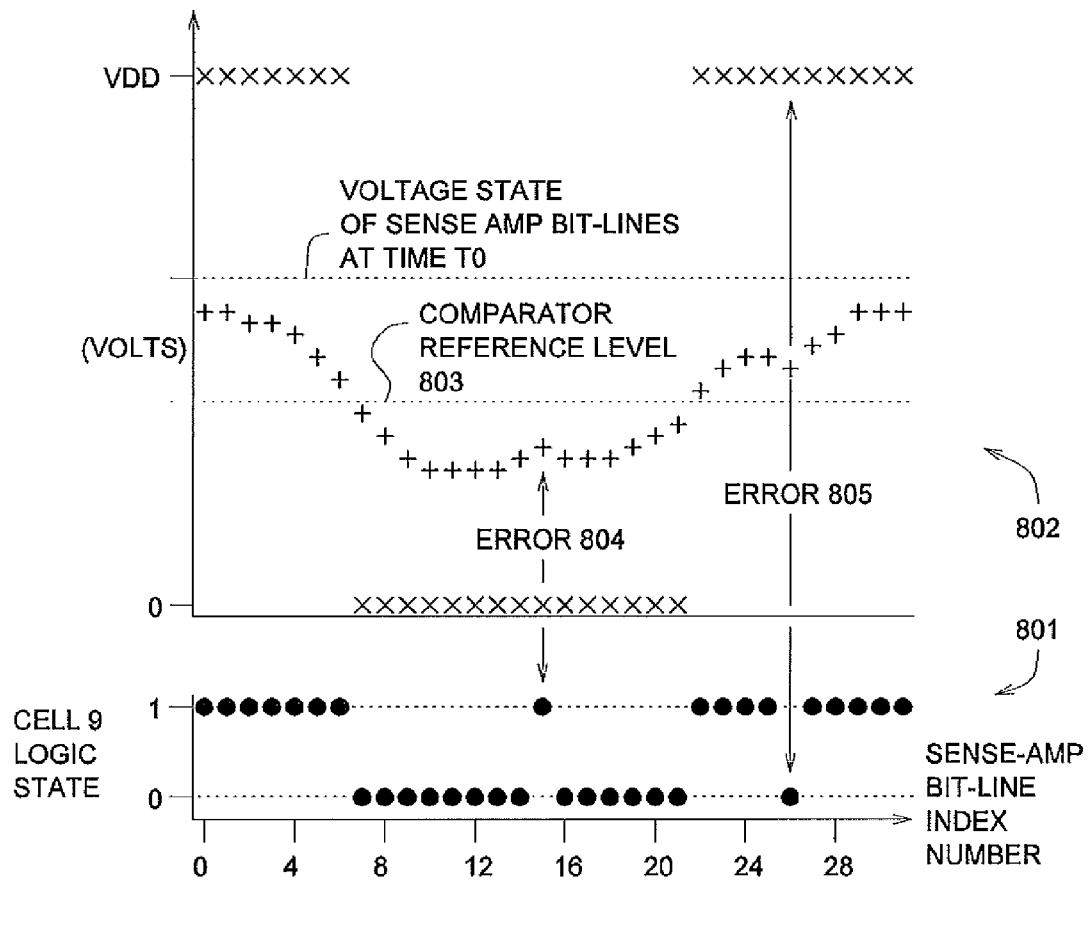
FIG. 8 is a graphical representation of an example performance of a comparator as sense amplifier in a memory system that has cross-talk between bitlines.

FIG. 8, graph 800, is an illustration of the performance of a comparator as sense amplifier in a memory system that has cross-talk between bitlines. A comparator in the context of graph 800 is a device that receives a bitline information signal as a voltage level that is compared to a fixed voltage to produce an output state, as opposed to the sense amplifier of the present disclosure which determines an output state of a bitline information signal by receiving and filtering multiple bitline information signals. Therefore, in FIG. 8, said output state of the comparator is binary, having one voltage value when said input voltage level exceeds a reference value and having another voltage value when said input voltage is less than said reference value. For purposes of illustration in graph 802, said reference value is COMPARATOR REFERENCE LEVEL 803. In a manner similar to graph 702, points in graph 802 representing a VOLTAGE STATE OF A SENSE-AMP BIT-LINE AT TIME T1 illustrate an effect of strong cross-talk between immediately adjacent SENSE-AMP bitlines. For the illustration in graph 802, a VOLTAGE STATE OF A COMPARATOR OUTPUT is determined based on whether or not a corresponding VOLTAGE STATE OF A SENSE-AMP BIT-LINE AT TIME T1 exceeds COMPARATOR REFERENCE LEVEL 803. For each VOLTAGE STATE OF A SENSE-AMP BIT-LINE AT TIME T1 exceeding COMPARATOR REFERENCE LEVEL 803, a VOLTAGE STATE OF A COMPARATOR OUTPUT equal to VDD volts is illustrated. For each VOLTAGE STATE OF A SENSE-AMP BIT-LINE AT TIME T1 less than COMPARATOR REFERENCE LEVEL 803, a VOLTAGE STATE OF COMPARATOR OUTPUT equal to 0 volts is illustrated. If VDD volts at a COMPARATOR OUTPUT is defined to represent a logic state of 1, and if 0 volts at a COMPARATOR OUTPUT is defined to represent a logic state of 0, it can be seen from graph 800 that two errors occur in VOLTAGE STATE OF COMPARATOR OUTPUT. ERROR 804 illustrates an instance of CELL 9 LOGIC STATE being 1 while VOLTAGE STATE OF COMPARATOR OUTPUT indicates a 0 logic state. ERROR 805 illustrates an instance of CELL 9 LOGIC STATE being 0 while VOLTAGE STATE OF COMPARATOR OUTPUT indicates a 1 logic state. Sense amplifiers of the present disclosure facilitate a performance resembling the illustration in FIG. 7 thereby avoiding errors such as ERROR 804 and ERROR 805 illustrated in FIG. 8.

Many details have been described with respect to the disclosed sense amplifier, memory cells, bitlines, and word lines. After reading this specification, those skilled in the art will appreciate that the various aspects and embodiments discussed herein are only illustrative and do not limit the scope of the present invention and that many variations are possible.

For example, while a two state memory cell has been described above, one skilled in the art will appreciate that a multi-state memory cell can also be implemented as described with reference to FIG. 9.

Figure 9:
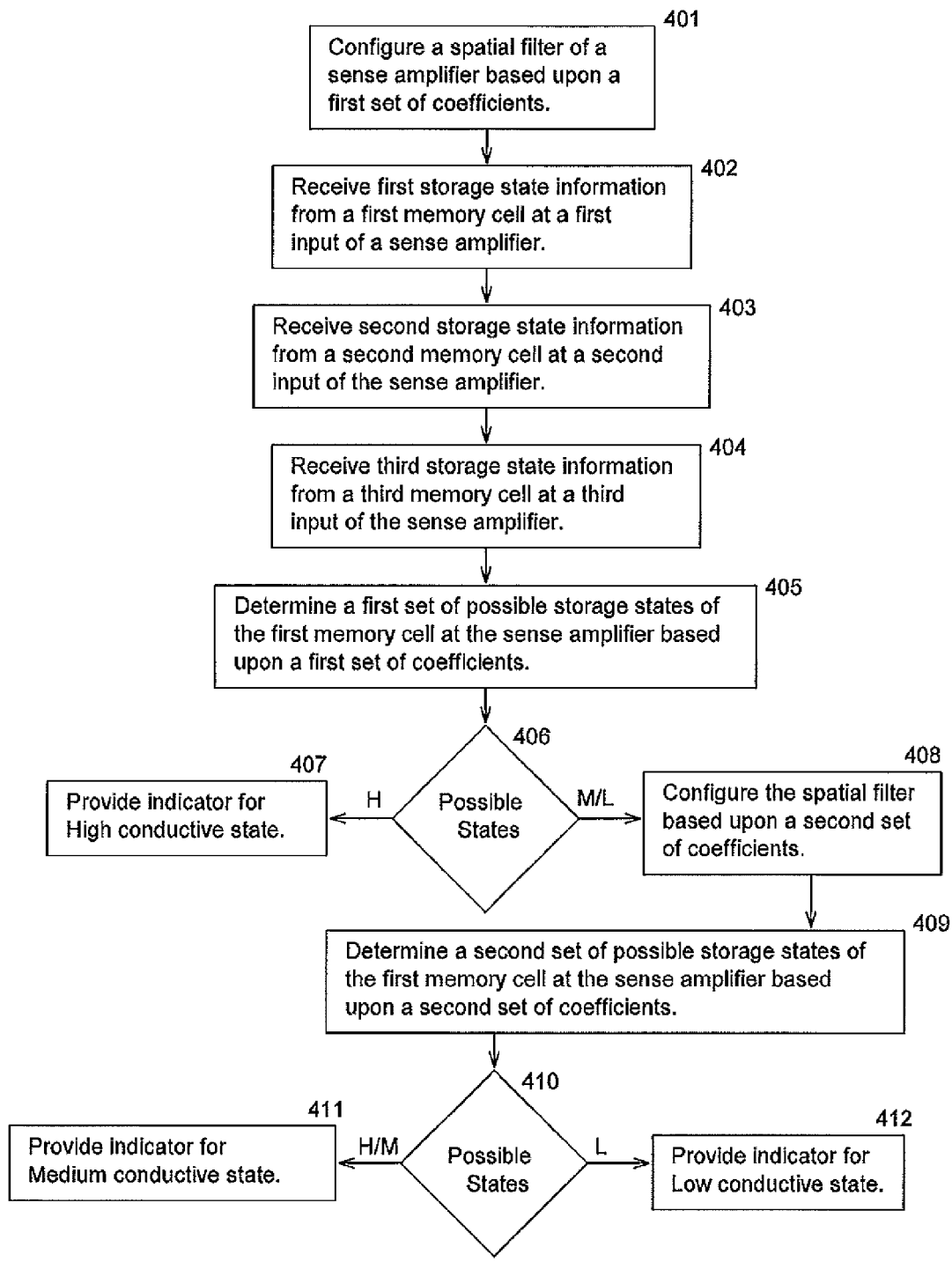
FIG. 9 illustrates in flow diagram form one embodiment of a method in accordance with a specific embodiment of the present disclosure.

FIG. 9 illustrates a method in accordance with a particular embodiment of the present disclosure. At node 401, a spatial filter of a sense amplifier is configured based upon a first set of coefficients. In such an embodiment, a variable capacitor, such as a switching capacitor, can be used to select between various capacitances that correspond to a specific set of coefficients of a spatial filter as previously described. The spatial filter will be able to determine whether a memory cell has a conductance above or below a specific conductance based upon the first set of coefficients.

At node 402, first storage state information is received at a first input of the sense amplifier from a first memory cell, where the first storage state information is based upon the storage state of the first memory cell. At node 403, second storage state information is received at a second input of the sense amplifier from a second memory cell, where the second storage state information is based upon the storage state of a second memory cell. At node 404, third storage state information is received at a third input of the sense amplifier from a third memory cell, where the third storage state information is based upon the storage state of a third memory cell.

At node 405, a first set of possible storage states is determined based upon the first set of coefficients and the first, second, and third storage state information. For example, assuming a memory cell is capable of being programmed to one of three conductive states, high, medium or low, the first set of coefficients can be selected to allow the spatial filter to determine whether the first storage state information is indicative of the first memory cell being in a high conductive state or in either the low or medium conductive state.

At node 406, if the set of conductive states is the high conductive state flow proceeds to node 407 where an indicator is provided to the output of the sense amplifier that the first information indicates the first memory cell in a high conductive state. Otherwise, if the set of conductive states is the medium and low conductive state flow proceeds to node 408.

At node 408, the spatial filter of the sense amplifier is configured by changing the coefficients of a spatial filter to be a second set of coefficients to allow the spatial filter to determine whether the memory cell has a conductance above or below a different conductivity that allows the spatial filter to distinguish between the low conductive state and the medium conductive state of the memory cell. The coefficients can be adjusted by varying the value of a switching capacitor.

At node 409, a second set of possible storage states is determined based upon the second set of coefficients and the first, second, and third storage state information. For example, the second set of coefficients can be selected to allow the spatial filter to determine whether the first storage state information is indicative of the first memory cell being in either the high or medium conductive state, or in the low conductive state. At step 410, flow proceeds to node 411 when the spatial filter determines the first information is indicative of the high or medium conductive state. Otherwise flow proceeds to node 412.

At node 411 an indicator is provided to the output of the sense amplifier that the first information indicates the first memory cell in the medium conductive state. At node 412 an indicator is provided to the output of the sense amplifier that the first information indicates the first memory cell in the low conductive state.

In accordance with another embodiment that supports memory cells capable of representing more than two storage states, a sense amplifier can be implemented that includes multiple spatial filters having different sets of coefficients that decode possible sets of storage states simultaneously, as opposed to the implementation of FIG. 9, which uses a single spatial filter that decodes possible storage states sequentially after changing the coefficients of the spatial filter.

Figure 10:
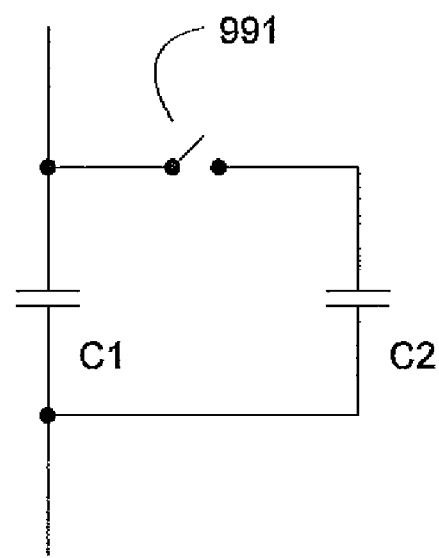
FIG. 10 illustrates a variable capacitor that can be used in accordance with one embodiment of the present disclosure.

In accordance with a particular embodiment, a multi-state cell will generally require sensing with higher gain, A1, as opposed to a two-state memory cell, to accommodate the smaller difference between one state and another in a multi-state cell. Also, to distinguish between one pair of states, one OFFSET weight or voltage would be used. Then, to distinguish between a second pair of states, a second OFFSET weight or voltage would be used. Therefore, a multi-state sensing system could be implemented such that A1, A2/A1 and A3/A1 would be constant and only A0, or the OFFSET weight or voltage, would need to be switched to sense the distinctions of multiple states. In such an embodiment, a switching capacitor could be used to select between various capacitance values. For example, FIG. 10 illustrates a switching capacitor 390 having capacitors C1, C2, and switch 391, whereby the capacitance of the switching capacitor 990 can be changed by controlling switch 991. In one embodiment, by implementing capacitor 314 (FIG. 5) with a switching capacitor, such as switching capacitor 990, the coefficient A0 can be varied. Thus, the coefficients set for a multi-state system would differ from a binary state system, however, there would not be a need to reset all coefficients to sense each state in a multi-state system.

While the embodiments are described with respect to voltage signals, it will be appreciated that various signals can be current signals. Similarly, in another embodiment the spatial filter herein can be implemented using digital processing instead of reactive elements. In addition, while each bitline has generally been described as being single-ended, they can also represent twisted bitline pairs, though one skilled in the art will recognize that the use of differential pairs to reduce cross-talk is not needed with the disclosure herein. In addition, one skilled in the art will appreciate that a sense amplifier can be implemented that is connected to just two bitlines, where the sense amplifier uses a de-convolving spatial filter as disclosed herein, as opposed to a traditional two-input comparator. The sense amplifier of the present disclosure can also be connected to more than the illustrated number of inputs. The sense amplifier of the present disclosure can also be implemented in many various manners. For example, the de-convolving-spatial filter, which removes the cross-talk introduced at a bitline being read from an adjacent bitline, can be a non-linear filter, can be implemented digitally, whereby an analog-to-digital converter converts the input signals for processing.

In accordance with another embodiment, the sense amplifiers can have the same or different coefficients. For example, the sense amplifiers at the ends of the memory array, which are adjacent to only one other sense amplifier, can have different coefficients than the sense amplifiers that are adjacent to two sense amplifiers. In yet another embodiment, the summing amplifier can be a linear summing amplifier, or a non-linear summing amplifier.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A device comprising:
    a memory array including
        a first bitline to communicate first information during a read operation, the first information including first storage state information from one of a first plurality of memory cells,
        a second bitline to communicate second information during the read operation, the second information including second storage state information from one of a second plurality of memory cells,
        a third bitline to communicate third information during the read operation, the third information including third storage state information from one of a third plurality of memory cells during the read operation,
        a fourth bitline to communicate fourth information during the read operation, the fourth information including fourth storage state information from one of a fourth plurality of memory cells,
        a fifth bitline to communicate fifth information during the read operation, the fifth information including fifth storage state information from one of a fifth plurality of memory cells;
    a first sense amplifier including a first input coupled to the first bitline to receive the first information, a second input coupled to the second bitline to receive the second information, a third input coupled to the third bitline to receive the third information, and an output to provide an indicator of the first storage state information based upon the first information, the second information and the third information;
    a second sense amplifier including a first input coupled to the second bitline to receive the second information, a second input coupled to the fourth bitline to receive the fourth information, a third input coupled to the first bitline to receive the first information, and an output to provide an indicator of the second storage state information based upon the second information, the fourth information and the first information; and
    a third sense amplifier including a first input coupled to the third bitline to receive the third information, a second input coupled to the first bitline to receive the first information, a third input coupled to the fifth bitline to receive the fifth information, and an output to provide an indicator of the third storage state information based upon the third information, the first information and the fifth information.

2. The device of claim 1 wherein the first sense amplifier comprises a spatial filter to determine the indicator of the first storage state information based upon a physical relationship between the first bitline and at least one other bitline.

3. The device of claim 2 wherein the spatial filter of the first sense amplifier is to determine the indicator of the first storage state information based upon a physical relationship between the first bitline and the second bitline.

4. The device of claim 3 wherein the second sense amplifier comprises a spatial filter to determine the indicator of the second storage state information based upon a physical relationship between the second bitline and the first bitline.

5. The device of claim 2, wherein the spatial filter comprises a summing module including an output to provide a first intermediate information based upon the first information, the second information and the third information, the first intermediate information used to determine the indicator of the first storage state information.

6. The device of claim 1, wherein the first bitline is between the second bitline and the third bitline, the second bitline is between the fourth bitline and the first bitline, and the third bitline is between the first bitline and the fifth bitline.

7. The device of claim 6 wherein the first sense amplifier comprises a spatial filter to determine the indicator of the first storage state information based upon a physical relationship between the first bitline and the second bitline and not based upon a physical relationship between the first and fourth bitline.

8. The device of claim 6 wherein the first sense amplifier comprises a spatial filter to determine the indicator of the first storage state information based upon a physical relationship between the first bitline and the second bitline and based upon a physical relationship between the first and fourth bitline.

9. The device of claim 1 wherein the first sense amplifier comprises a spatial filter to determine the indicator of the first storage state information based upon a physical relationship between a first plurality of bitlines that includes the first bitline, and the second sense amplifier comprises a spatial filter to determine the indicator of the second storage state information based upon a physical relationship between a second plurality of bitlines that includes the second bitline.

10. The device of claim 1 wherein the first sense amplifier comprises a spatial filter that determines the indicator of the first storage state information based upon a physical relationship amongst the first bitline, the second bitline, and the third bitline.

11. The device of claim 1, wherein the first sense amplifier comprises a summing amplifier including a first input coupled to the first bitline, a second input coupled to the second bitline, and a third input coupled to the third bitline, and an output to provide a first intermediate information used to determine the indicator of the first storage state information.

12. A device comprising:
    a memory array including a first bitline coupled to communicate first information during a read operation, including first storage state information from one of a first plurality of memory cells, a second bitline coupled to communicate second information, including second storage state information during the read operation from one of a second plurality of memory cells, and a third bitline coupled to communicate third information during the read operation, including third storage state information from one of a third plurality of memory cells; and a first sense amplifier comprising a summing amplifier, a storage state detect module, a first input coupled to the first bitline, a second input coupled to the second bitline, and a third input coupled to the third bitline, the summing amplifier comprising an output to provide an intermediate information based upon the first information, the second information and the third information, and the storage state detect module coupled to the output of the summing amplifier to determine an indicator of the storage state of the one of the first plurality of memory cells during the read operation based upon the intermediate information.

13. The device of claim 12, wherein the indicator of the storage state of the one of the first plurality of memory cells is a logic value.

14. The device of claim 13, wherein the logic value is a binary logic value.

15. The device of claim 12, wherein the memory array further comprises a fourth bitline coupled to communicate fourth information during the read operation, including fourth storage state information from one of a first plurality of memory cells, and the device further comprising:

a second sense amplifier comprising a summing amplifier, a storage state detect module, a first input coupled to the second bitline, a second input coupled to the third bitline, and a third input coupled to the fourth bitline, the summing amplifier comprising an output to provide an intermediate information based upon the first information, the second information and the fourth information, and the storage state detect module coupled to the output of the summing amplifier to determine an indicator of the storage state of the one of the second plurality of memory cells during the read operation based upon the intermediate information.

16. A device comprising:

a memory array including a first bitline coupled to communicate first information, including first storage state information from one of a first plurality of memory cells, a second bitline coupled to communicate second information, including second storage state information from one of a second plurality of memory cells, and a third bitline coupled to communicate third information, including third storage state information, from one of a third plurality of memory cells; and a first sense amplifier comprising a first spatial filter having a first input coupled to the first bitline, a second input coupled to the second bitline, a third input coupled to the third bitline, and an output to provide a first intermediate information during a read operation based upon the first information, the second information and the third information, and based upon a physical relationship between the first bitline, the second bitline and the third bitline.

17. A method comprising:

receiving via a first bitline, at a first input of a first sense amplifier, first information during a read operation, the first information including first storage state information from one of a first plurality of memory cells;

receiving via a second bitline, at a second input of the first sense amplifier, second information during the read operation, the second information including second storage state information from one of a second plurality of memory cells;

receiving via a third bitline, at a third input of the first sense amplifier, third information during the read operation, the third information including third storage state information from one of a third plurality of memory cells; and determining at the first sense amplifier an indicator corresponding to the first storage state information, wherein the indicator is determined based upon the first information, the second information and the third information.

18. The method of claim 17 further comprising:

receiving, at a first input of a second sense amplifier, the second information via the first bitline during the read operation;

receiving, at a second input of the second sense amplifier, the first information via the second bitline during the read operation;

receiving via a fourth bitline, at a third input of the second sense amplifier, fourth information during the read operation, the fourth information including fourth storage state information from one of a fourth plurality of memory cells; and determining at the second sense amplifier an indicator corresponding to the second storage state information, wherein the indicator is determined based upon the second information, the first information and the fourth information.

19. The method of claim 18, wherein the first bitline is between the second bitline and the third bitline, and the second bitline is between the first bitline and the fourth bitline.

20. The method of claim 17, wherein determining further comprises filtering the first information, the second information, and the third information based a physical relationship amongst the first bitline, the second bitline, and the third bitline.

* * * * *